(12) United States Patent
Li et al.

(10) Patent No.: US 7,916,515 B2
(45) Date of Patent: Mar. 29, 2011

(54) NON-VOLATILE MEMORY READ/WRITE VERIFY

(75) Inventors: Hai Li, Eden Prairie, MN (US); Yiran Chen, Eden Prairie, MN (US); Harry Hongyue Liu, Maple Grove, MN (US); Alan Xuguang Wang, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 86 days.

(21) Appl. No.: 12/401,438

(22) Filed: Mar. 10, 2009

(65) Prior Publication Data

US 2010/0232206 A1 Sep. 16, 2010

(51) Int. Cl.
*G11C 11/56* (2006.01)
(52) U.S. Cl. ........................................ 365/148; 365/173
(58) Field of Classification Search .................. 365/148, 365/173
See application file for complete search history.

(56) References Cited

U.S. PATENT DOCUMENTS

| 7,286,394 | B2 | 10/2007 | Ooishi |
| 7,345,912 | B2 | 3/2008 | Luo et al. |
| 2004/0114444 | A1* | 6/2004 | Matsuoka ..................... 365/200 |
| 2006/0221752 | A1* | 10/2006 | Fasoli et al. .............. 365/230.03 |
| 2008/0056023 | A1 | 3/2008 | Lee et al. |

OTHER PUBLICATIONS

M. Hosomi, H. Yamagishi, T. Yamamoto, K. Bessho, Y. Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," Proc. International Electron Device Meeting Tech. Digest, 2995, pp. 473-476, IEEE.

* cited by examiner

*Primary Examiner* — Michael T Tran
(74) *Attorney, Agent, or Firm* — Fellers, Snider, et al.

(57) ABSTRACT

An apparatus and associated method for writing data to a non-volatile memory cell, such as a resistive random access memory (RRAM) cell. In some embodiments, a control circuitry is configured to write a logic state to a resistive sense element while simultaneously verifying the logic state of the resistive sense element.

20 Claims, 5 Drawing Sheets

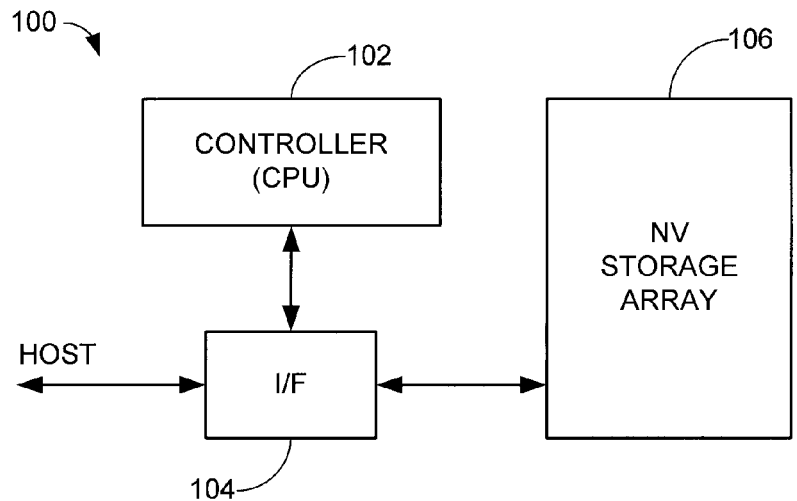
FIG. 1
DATA WRITE OPERATION
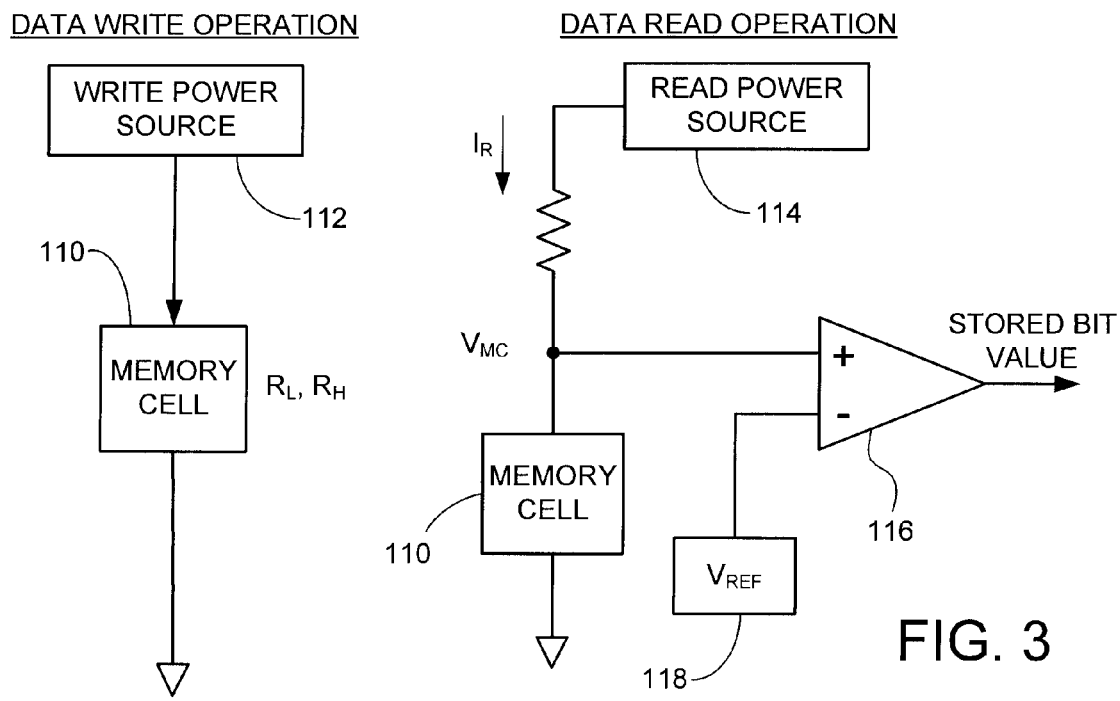
FIG. 2
DATA READ OPERATION
FIG. 3

NON-VOLATILE MEMORY READ/WRITE VERIFY

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency and accuracy during operation, particularly with regard to the reliability of writing data to a memory cell.

SUMMARY

Various embodiments of the present invention are generally directed to an apparatus and associated method for writing data to a non-volatile memory cell, such as a resistive random access memory (RRAM) cell.

In accordance with various embodiments, the apparatus generally comprises a control circuit configured to write a logic state to a resistive sense element while simultaneously verifying the logic state of the resistive sense element.

In other embodiments, the method generally comprises writing a logical state to a resistive sense element (RSE), and simultaneously verifying the written logical state of the RSE during the writing step.

These and various other features and advantages which characterize the various embodiments of the present invention can be understood in view of the following detailed discussion and the accompanying drawings.

BRIEF DESCRIPTION OF THE DRAWINGS

FIG. 1 is a generalized functional representation of an exemplary data storage device constructed and operated in accordance with various embodiments of the present invention.

FIG. 2 generally illustrates a manner in which data can be written to a memory cell of the memory array of FIG. 1.

FIG. 3 generally illustrates a manner in which data can be read from the memory cell of FIG. 2.

DETAILED DESCRIPTION

Figure 4A:
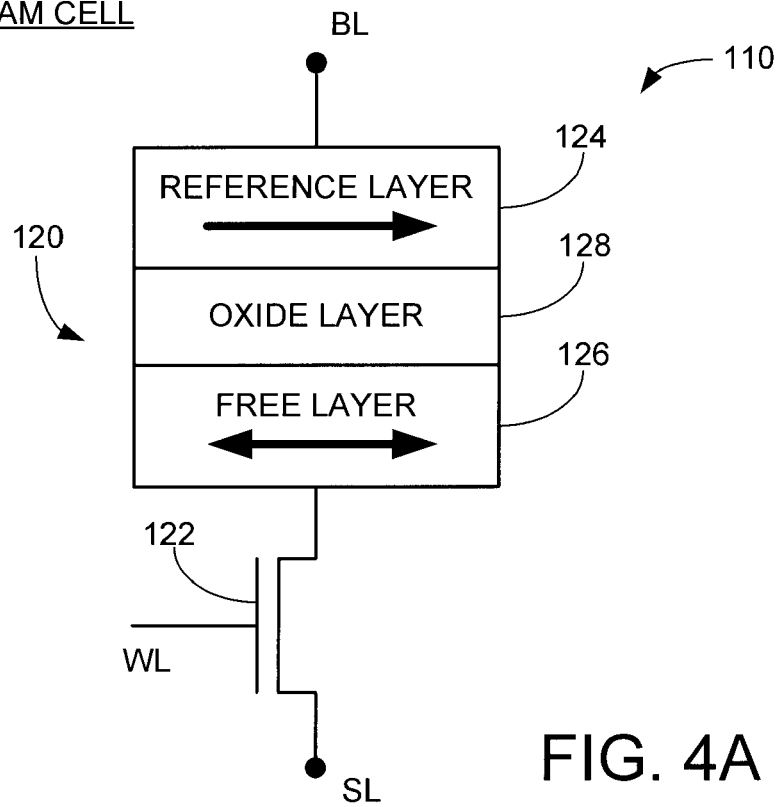
FIGS. 4A-4B illustrate exemplary constructions for the memory cell of FIGS. 2-3.

FIG. 1 provides a functional block representation of a data storage device 100 constructed and operated in accordance with various embodiments of the present invention. The device 100 includes a top level controller (CPU) 102, an interface (I/F) circuit 104 and a non-volatile (NV) data storage array 106. The I/F circuit 104 operates under the direction of the controller 102 to transfer data between the array 106 and a host device.

The data storage array 106 is formed from an array of non-volatile memory cells which store data in relation to programmable resistance states of the cells. Data are written to the cells as generally set forth in FIG. 2.

During a data write operation upon a selected memory cell 110, a write power source 112 applies the necessary input such as in the form of a selected write current or voltage to configure the cell 110 to the desired state. In some embodiments, each cell stores a single logical bit value of 0 or 1. A relatively low programmed resistance, such as RL, can be used to denote a logical 0, and a relatively high programmed resistance, such as RH, can be used to denote a logical 1. In other embodiments, multiple resistance levels are provided which enables individual cells to store multiple bits. For example, four resistance levels ($R_1 < R_2 < R_3 < R_4$) can be used to store two bits (e.g., a resistance of $R_1$=00; $R_2$=01; $R_3$=10 and $R_4$=11). More generally, the use of $2^N$ selectively programmable states can be used to store N bits of data.

A data read operation can be carried out as generally set forth by FIG. 3 to read a previously written state of the cell 110. A read power source 114 supplies an appropriate read bias current $I_R$ which is applied to the memory cell 110. A voltage drop across the memory cell, $V_{MC}$, will have a magnitude in relation to the programmed state of the cell. For example, using the single bit write operation illustrated in FIG. 2, $V_{MC}$ will be generally proportional to $I_R R_L$ when the cell 110 is programmed to the low resistance $R_L$, and $V_{MC}$ will be generally proportional to $I_R R_H$ when the cell 110 is programmed to the high resistance $R_H$.

The voltage $V_{MC}$ is sensed by a sense amplifier 116, which compares the voltage $V_{MC}$ to a suitable reference voltage $V_{REF}$ from a reference voltage source 118. If the reference voltage $V_{REF}$ has a magnitude that falls between the respective high and low $V_{MC}$ levels, the sense amplifier will be able to reliably output a logic bit (0 or 1) that corresponds to the programmed state of the cell 110.

A write-read-verify operation can be carried out when data are written to the cells 110 of the array 106 to ensure that the contents of the array accurately match the input data supplied thereto. A write-read-verify operation can be carried out by first writing the desired state to the cell 110 as shown in FIG. 2, and then following this with a read operation upon the cell 110 as shown in FIG. 3. If the input data are not correctly retained by the cell, the cell can be identified as having a defect and can be deallocated from the array. This helps to ensure data integrity.

While operable, a disadvantage of this approach is the penalty paid in the time required to carry out each data write operation, since the write operation cannot be declared completed until the data have been successfully read back. Those skilled in the art will appreciate that various factors, such as parasitic capacitances, can increase the time required to both write the data state to the cell, and to subsequently read the written state from the cell. This reduces the ability of the device 100 in FIG. 1 to quickly transfer data from the host to the array 106.

It will further be appreciated that devices such as 100 in FIG. 1 can utilize a hierarchy of data caches and buffers between the host and the storage array (main memory) 106. For example, local L1, L2 and L3 caches may be incorporated into the controller 102 to store data and instructions in fast accessible memory. One or more data buffers may be incorporated into the I/F circuitry 104 to store data pending transfer to or from the array 106. The use of write-read-verify operations upon these caches and buffers can further help to ensure data integrity, but at the potential cost of additional reductions in overall data transfer rates.

Accordingly, as explained below various embodiments of the present invention operate to simultaneously read a memory cell during the writing of the data to the cell. This is generally carried out by sensing the transition in resistance of the cell from the write current as the desired state is written. This eliminates the need to follow up with a subsequent application of a read bias current to read the cell. Different reference voltages and/or different sense amplifiers may be switched in depending on which state is being written to the cell. In some embodiments, one or more of the sense amplifiers used during the simultaneous read operation can subsequently be used during normal read operations.

The simultaneous read operations presented herein can be applied to any number of different types of memory cells. Two exemplary cell constructions are set forth by FIGS. 4A and 4B.

FIG. 4A shows the memory cell 110 configured as a spin-torque transfer random access memory (STRAM) cell. The memory cell 110, also referred to herein as a unit cell, generally comprises a resistive sense element (RSE) 120 and a switching device 122. In some embodiments, the RSE is characterized as a magnetic tunneling junction (MTJ), and the switching device is characterized as a metal oxide semiconductor field effect transistor (MOSFET).

The RSE 120 includes a fixed magnetic reference layer 124 and a free magnetic layer 126 separated by an intervening antiferromagnetic layer 128. In some embodiments, the reference layer 124 comprises spin polarizing material that orients the spin of current passing through the MTJ in a predetermined direction. The magnetization direction of the reference layer 124 may be pinned to a separate layer (not shown) that maintains the reference layer in a specified magnetic orientation. In other embodiments, additional layers (not shown) can provide spin polarizing characteristics capable of injecting spin torque-transfer switching in the MTJ.

The free layer 126 is also formed of a suitable magnetic material, and is arranged so as to have selectively different magnetization directions which are established responsive to the application of suitable write currents. The intervening layer 128 can take any number of suitable constructions, such as Magnesium Oxide (MgO). While the respective magnetization directions are shown to be substantially perpendicular to the direction of write current, those skilled in the art will appreciate that other magnetic orientations, including parallel orientations, can be utilized as desired. Those skilled in the art will appreciate that additional layers, including seed layers, shield layers, and additional free and/or reference layers can be incorporated into the RSE 120 as desired, but such have been omitted for clarity.

A low resistance state for the RSE 120 in FIG. 4A can be achieved when the magnetization of the free layer 126 is oriented to be substantially in the same direction (parallel) as the magnetization of the reference layer 124. To orient the RSE 120 to a parallel (P) resistance state, a write current passes downwardly through the MTJ from a bit line (BL) to a source line (SL) so that the magnetization direction of the reference layer 124 sets the magnetic orientation of the free layer 126.

A high resistance state for the RSE 124 is characterized as an anti-parallel orientation in which the magnetization direction of the free layer 126 is substantially opposite that of the reference layer 124. To orient the RSE 120 in the anti-parallel (AP) resistance state, a write current passes upwardly through the MJT 120 from the SL to the BL. This write current sets the direction of magnetization of the free layer 126 so as to be opposite that of the reference layer 124.

Figure 4B:
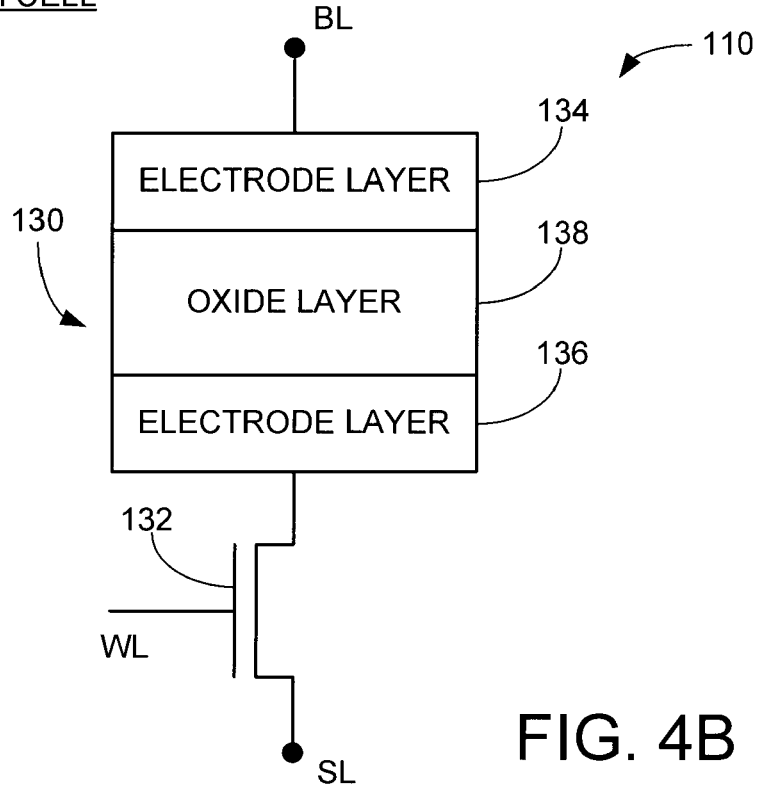

FIG. 4B shows the memory cell 110 of FIGS. 2 and 3 with a resistive random access memory (RRAM) construction. As before, the cell 110 in FIG. 4B includes a resistive sense element (RSE) 130 in series with a switching device (MOSFET) 132.

The RSE 130 in FIG. 4B is formed from opposing electrode layers 134, 136 which are separated by an intervening oxide layer 138. Changes in RSE resistance are obtained by extending one or more electrically conductive metallization filaments (not shown) through the oxide layer from one electrode to the other electrode. The presence of the filaments lowers the overall characteristic resistance of the cell 110.

The filaments are formed through the application of an appropriate voltage potential and/or current in the appropriate direction to promote metallization. Such filaments are subsequently retracted through the application of an appropriate write voltage potential and/or current in a different direction through the RSE.

It is contemplated that applying a suitable voltage across the RRAM cell 110 in FIG. 4B from BL to SL will promote the formation of one or more filaments that extend from the top electrode layer 134 to the bottom electrode layer 136. This will provide the RSE 130 with a low resistance $R_L$. Applying a suitable voltage across the cell in the opposite direction from SL to BL will result in retraction of the filament(s), returning the RSE 130 to a high resistance $R_H$.

The write current magnitude required to program a given RSE to a given programmed resistance state is generally inversely proportional to the write current pulse width. For example, the current magnitude to program the STRAM cell 110 in FIG. 4A can be generally modeled by the following theoretical equation:

$$I_C = I_{CO}\{1 - ((kT)/E)\ln(\tau/\tau_0)\} \qquad (1)$$

where $I_C$ is the critical switching current, which is the minimal current required for RSE resistance switching; $I_{CO}$ is the critical switching current at 0K; E is the magnetization stability energy barrier; $\tau$ is pulse duration time; and $\tau_0$ is the inverse of the attempt frequency. From equation (1) it can be seen that for a smaller magnitude of applied switching current, generally a longer writing pulse will be required, and vice versa. It has been found that below around 10 ns, short time magnetization dynamics can dominate and the critical switching current can increase rapidly.

It has been found that the required write current magnitude for RSE switching $I_C$ can vary from cell to cell and even from cycle to cycle. These cell-to-cell and cycle-to-cycle variations of $I_C$ (and/or the required write pulse width $\tau$) may result in an unsuccessful write to the memory cell from time to time, leading to an associated reduction in performance for a data storage device.

Figure 5:
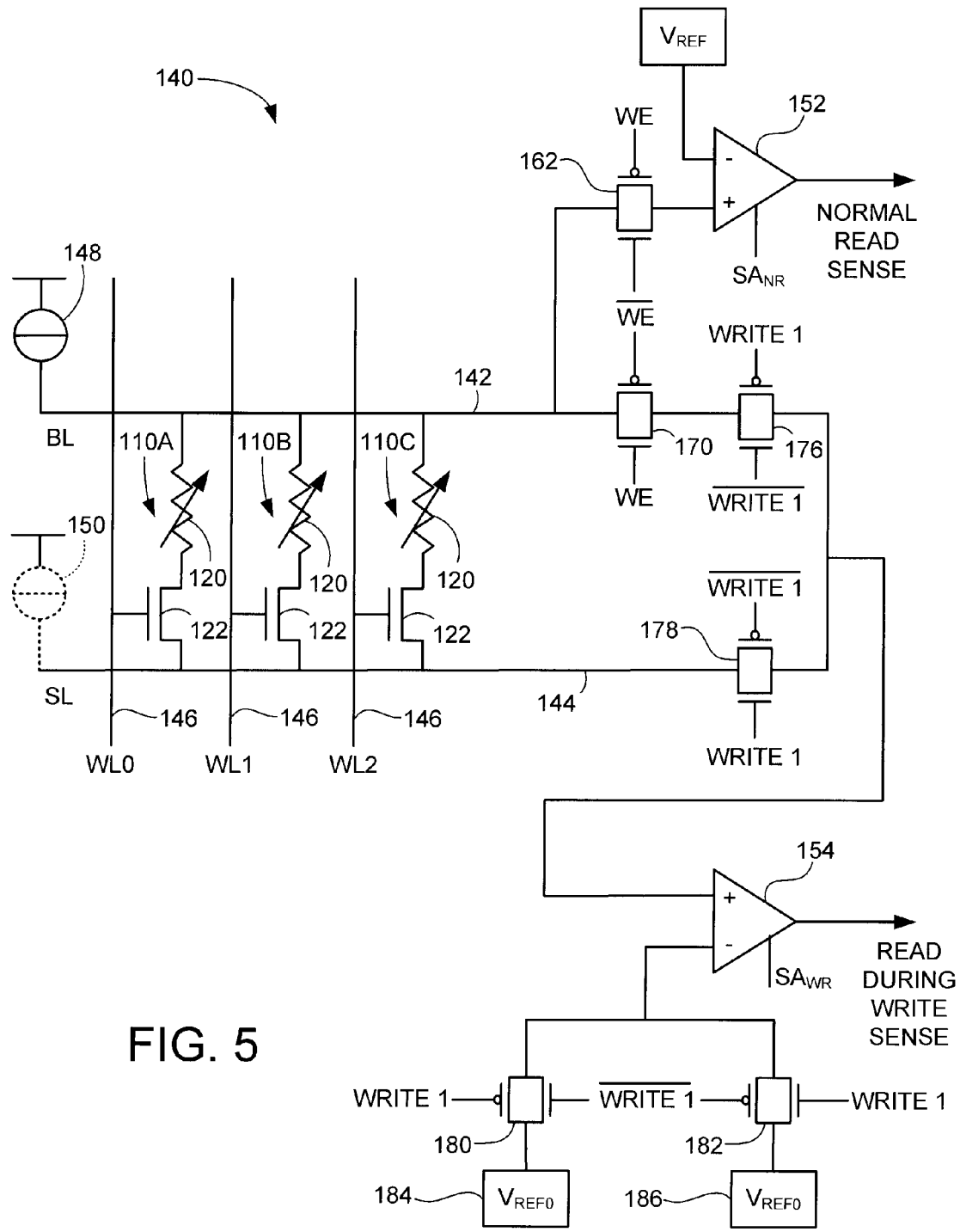
FIG. 5 shows control circuitry configured to write data to a memory cell in accordance with various embodiments of the present invention.

Accordingly, FIG. 5 provides a schematic representation of a control circuit 140 constructed and operated in accordance with various embodiments of the present invention. It is contemplated that the control circuit 140 represents at least portions of the array 106 of FIG. 1, and utilizes a number of STRAM memory cells as set forth by FIG. 4A. Such is merely illustrative, however, and is not limiting.

The memory cells are individually denoted as 110A, 110B and 110C, and are selectively accessed via a common bit line (BL) 142, a common source line (SL) 144, and respective word lines (WL0-2) 146. The word lines WL0-2 facilitate access to the individual memory cells through the application of a suitable voltage thereto, which serve to place the MOSFETs 122 into a drain-source conductive state. The orthogonal arrangements of the BL, SL and WLs in FIG. 5 can be readily modified, including the use of a source plane for enhanced data density.

First and second current drivers are respectively denoted at 148 and 150, with the first current driver selectively coupleable to the BL 142 and the second current driver selectively coupleable to the SL 144. A sense amplifier 152 is used for read sensing during normal read operations, and a sense amplifier 154 is used for read sensing during write operations. A number of multiplexors (MUXs) are used to selectively connect the sense amplifiers 152, 154 during these respective operations, as will now be explained.

Figure 6:
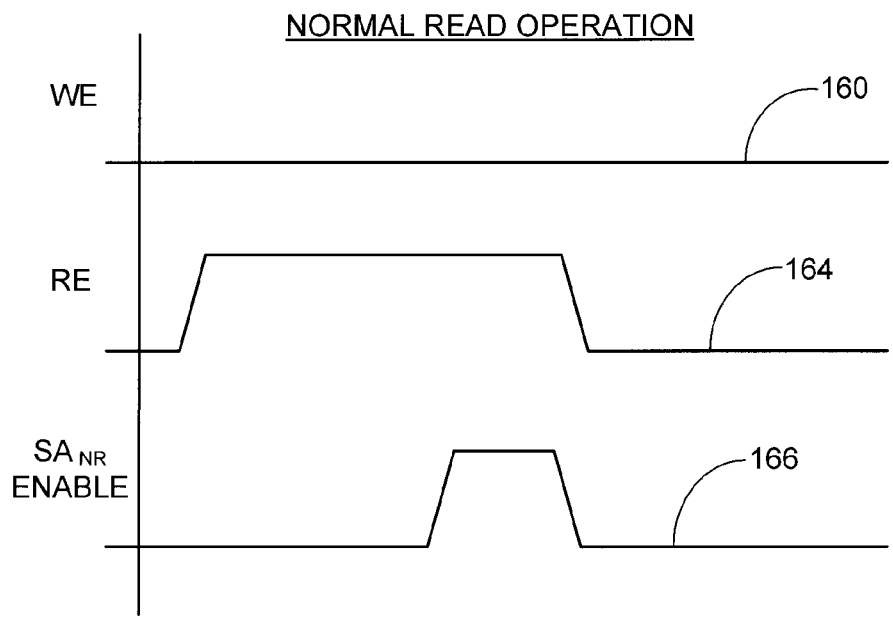
FIG. 6 generally illustrates a timing diagram for a normal read operation upon the memory cells of FIG. 5.

A normal read operation is carried out upon a selected memory cell in FIG. 5, in this case cell 110A, in accordance with the timing diagram of FIG. 6. During the normal write operation, a write enable (WE) signal is held low, as shown at 160 in FIG. 6. The WE signal is applied to a mux 162 in FIG. 5, which connects the BL 142 to the normal read (NR) sense amplifier 158.

A read enable (RE) signal is next asserted, as shown at 164 in FIG. 6, which directs a suitable read current from the driver 148 through the selected cell 110A. Although not shown in the timing diagrams, it will be appreciated that this read operation includes assertion of the WL0 146 to place the MOSFET 122 into a drain-source conductive state.

A sense amplifier enable signal $SA_{NR}$ is next asserted, as shown at 166 in FIG. 6, which enables the sense amplifier 152 to carry out a comparison of the voltage drop across the cell 110A with a suitable reference voltage $V_{REF}$ from source 168 (FIG. 5). The sense amplifier 152 accordingly outputs a "normal read sense" logic state indicative of the programmed state of the cell 110A; the output will be a logical 0 if the cell 110A is programmed low, and the output will be a logical 1 if the cell 110A is programmed high.

Figure 7:
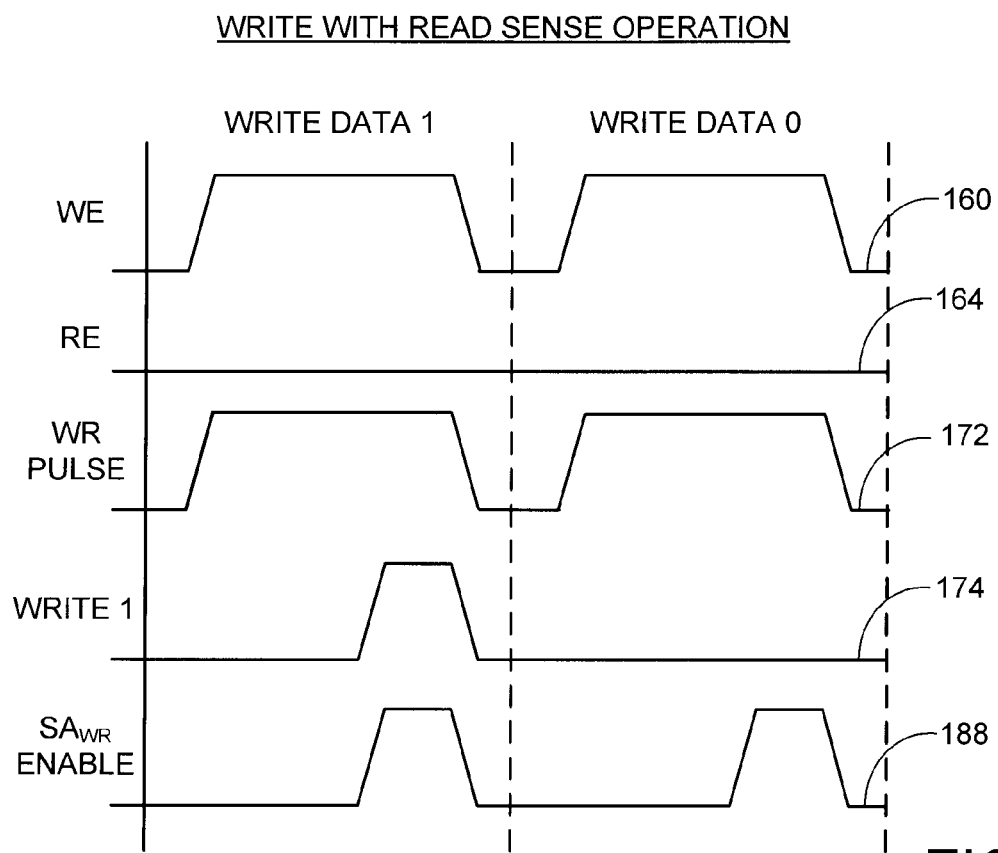
FIG. 7 generally illustrates a timing diagram for writing data to the memory cells of FIG. 5 while simultaneously reading the written states.

A write with read sense operation will next be described in accordance with the timing diagram of FIG. 7. The diagram of FIG. 7 is divided into two portions. The first, left-most portion is generally indicative of various signals during the writing of a logical 1 ("write data 1") to the memory cell 110A in FIG. 5. The second, right-most portion of FIG. 7 is generally indicative of various signals during the writing of a logical 0 ("write data 0") to the memory cell 110A. Each of these different write operations will be discussed in turn.

In the configuration of FIG. 5, it is contemplated that the writing of a logical 1 to the cell 110A involves the application of a suitable write current upwardly through the cell from the driver 150, so that the write current passes from the SL 144 to the BL 142. To this end, the aforementioned write enable (WE) signal 160 in FIG. 6 is initially asserted high. This disconnects the mux 162 in FIG. 5, taking the normal read sense amplifier 152 out of the circuit. It will be noted that the read enable (RE) signal 164 of FIG. 6 remains low throughout FIG. 7.

The high WE signal 160 asserts a mux 170 in FIG. 5 which is coupled to the BL 142 as shown. A current pulse, referred to herein as a write/read or WR pulse, is generally represented at 172 in FIG. 7, and corresponds to the application of the write current from the driver 150. The actual duration and shape of the write current pulse can vary depending on the requirements of a given application, so the WR pulse 172 generally serves to indicate the application of such current during some or all of the assertion of the WE signal 160.

FIG. 7 further shows a WRITE 1 signal 174, which is asserted high when the data to be written is a logical 1. The WRITE 1 signal 174 remains low when the data to be written is a logical 0. Upstream circuitry (not separately shown in FIG. 5) can be used to detect the written state and assert the WRITE 1 signal accordingly.

The WRITE 1 signal, and its complement, are respectively supplied to muxs 176, 178 in FIG. 5. These muxs respectively connect the appropriate control path (BL or SL) to the sense amplifier 154. In some embodiments, the sense amplifier 154 can be configured to detect an actual transition in programmed resistance as it occurs, or can be switched in to detect the transition immediately after it occurs. In either case, the sensing occurs simultaneously with the write since the voltage drop sensed by the sense amplifier 154 is generated by the write current used to set the programmed state of the cell, rather than by a subsequently applied read current. It is contemplated that in many cases, the simultaneous read sensing of the written state can occur within a single clock cycle of the write circuit.

As noted above, it is contemplated that different reference voltages may be required to sense a transition from 0 to 1 as compared to a transition from 1 to 0. To this end, FIG. 5 additionally provides muxs 180 and 182, which are responsive to the WRITE 1 signal 174 (and its complement) to respectively connect first and second reference voltages $V_{REF0}$ and $V_{REF1}$ from sources 184 and 186. During the writing of a logical 1, the mux 182 is asserted so that the $V_{REF1}$ voltage is supplied to the sense amplifier 154. A write/read sense enable signal ($SA_{WR}$) 188 in FIG. 7 is asserted to enable the sense amplifier 154 to carry out this comparison. If the writing operation is successful, the resulting output of the sense amplifier 154 will match the written state, that is, a logical 1. The sense amplifier 154 is thus used to verify the write operation.

The writing of a logical 0 to the cell 110A is carried out in similar fashion. It is contemplated in the circuit 140 of FIG. 5 that a write current to write a logical 0 will pass from the current driver 148 and downwardly through the cell 110A from the BL 142 to the SL 144. The various signals of FIG. 7 will be asserted as described above, resulting in the voltage drop across the cell from the write current being sensed by the sense amplifier 154 and compared to the reference voltage VREF0. As before, the writing operation is verified as successful if the output of the sense amplifier 154 is a logical 0.

Figure 8:
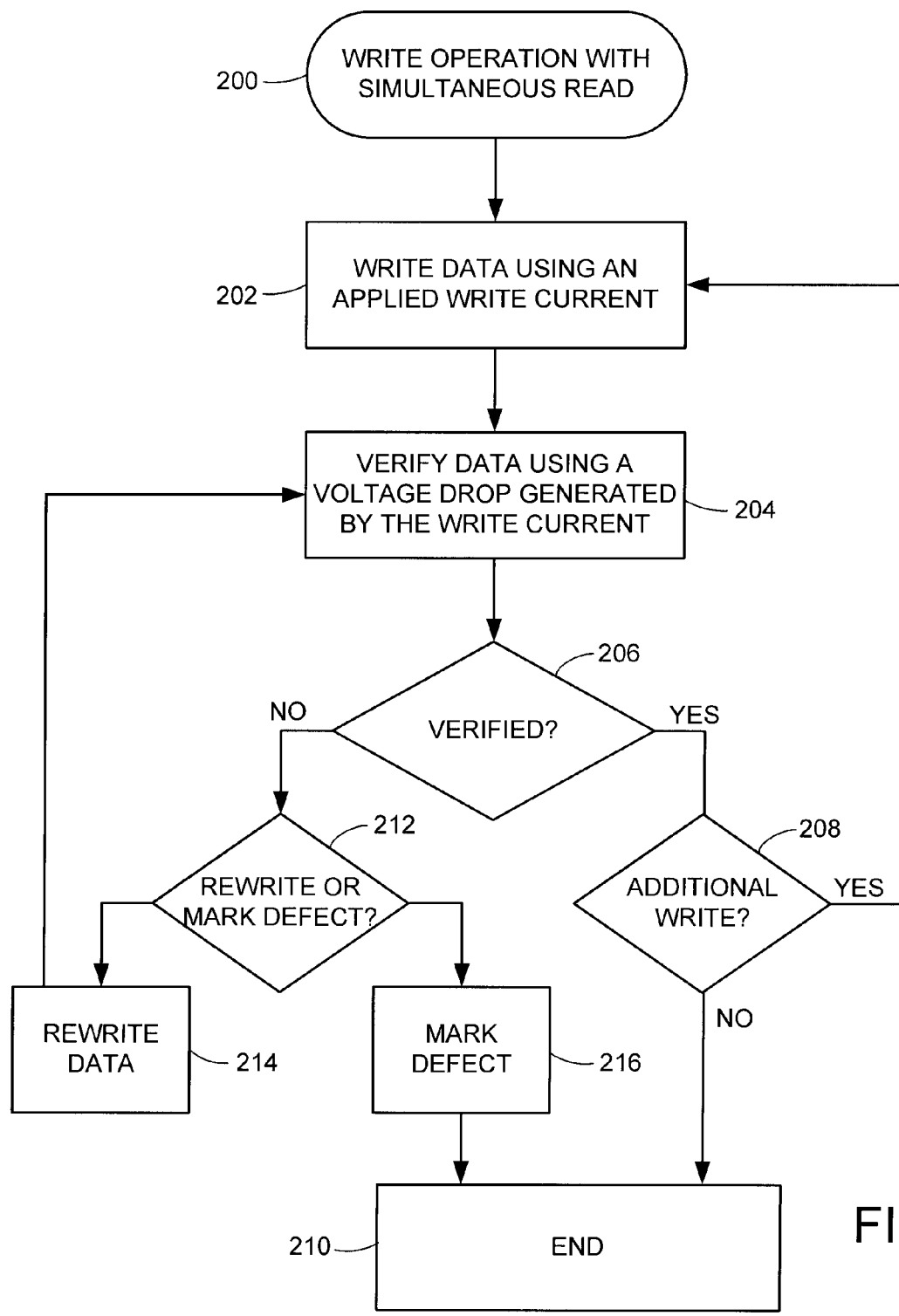
FIG. 8 shows a flow diagram for a routine performed in accordance with the various embodiments of the present invention.

FIG. 8 displays a flow diagram of a WRITE OPERATION WITH SIMULTANEOUS READ routine 200 to summarize the foregoing discussion.

A write operation is carried out at step 202 that involves writing a selected logic state to the RSE of a selected non-volatile memory cell, such as the RSE 120 of cell 110A in FIG. 5. When writing the selected logical state, the bit line voltage or the source line voltage will change when the state of the RSE switches. In step 204, a sense amplifier verifies the correct logic state was written to the RSE during the writing operation by comparing the post-write bit line and/or source line voltage with a suitable reference voltage. A skilled artisan can appreciate that the reference voltage could be different between writing a logic state "0" and "1". Thus, one or more muxs may be needed to select the corresponding reference voltage. A verification step is indicated by decision step 206. Upon verification of the logic state in step 204, the routine either moves on to the next write operation, as indicated by decision step 208, or ends at step 210.

In the event that the correct logic state was not written to the RSE, as shown by decision step 212 the circuit can make a determination whether to attempt a rewrite of the logic state, step 214, or to mark the cell as defective, step 216. In certain applications, a defective mark at step 216 can result in a new set of cells being allocated for the writing of the input data, and subsequent analysis of the marked cell can be carried out to determine whether the marked cell should be permanently deallocated from use.

As can be appreciated by one skilled in the art, the various embodiments illustrated herein provide advantages over the prior art. The simultaneous verification of written data during the write operation can enhance data throughput rates and reduce power consumption because separate read currents are not required to carry out read verify operations. It will be appreciated that the various embodiments discussed herein have numerous potential applications and are not limited to a certain field of electronic media or type of data storage devices.

For purposes of the appended claims, the term "simultaneous" and the like will be construed consistent with the foregoing discussion to describe a read sense verification that occurs during or immediately following a write state transition and uses a voltage drop generated by the write current used to induce such transition without the need to apply a separate read current to subsequently verify the written state.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising control circuitry configured to write a logic state to a resistive sense element (RSE) while simultaneously verifying the written logic state of the RSE, a first sense amplifier coupled to the RSE which is used during said simultaneous verification, and a second sense amplifier coupled to the RSE which is used to read the written logic state of the RSE during a subsequent read operation.

2. The apparatus of claim 1, wherein the logic state of the RSE is written by an application of a write current to the RSE, and wherein the written logic state is simultaneously verified by sensing a voltage drop across the RSE during the application of the write current.

3. The apparatus of claim 1, wherein the RSE is marked as defective after an error is detected during said simultaneous verification.

4. The apparatus of claim 1, wherein a first reference voltage is supplied to the first sense amplifier and a different, second reference voltage is supplied to the second sense amplifier.

5. The apparatus of claim 1, wherein the first sense amplifier receives as an input a voltage drop across the RSE, said voltage drop generated during passage of a write current through the RSE to write the logical state.

6. The apparatus of claim 5, wherein the first sense amplifier compares the voltage drop to a first reference voltage responsive to a first value for the written logical state, and wherein the first sense amplifier compares the voltage drop to a second reference voltage responsive to a second value for the written logical state.

7. The apparatus of claim 1, wherein the writing of the RSE and verification of the logic state uses a single write current pulse.

8. The apparatus of claim 1, wherein the writing of the RSE and verification of the logic state occurs over a single write clock cycle.

9. The apparatus of claim 1, wherein the RSE is characterized as a magnetic tunneling junction (MTJ).

10. A method comprising:
    writing a logical state to a resistive sense element (RSE) by applying a write current to the RSE to write the logical state thereto, the applied write current generating a voltage drop across the RSE; and
    simultaneously verifying the written logical state of the RSE during the writing step by sensing said voltage drop.

11. The method of claim 10, wherein the RSE is marked as defective after an error is detected.

12. The method of claim 10, wherein the RSE is connected to a plurality of sense amplifiers.

13. The method of claim 12, wherein a multiplexer provides reference values to each sense amplifier.

14. The method of claim 13, wherein the reference values are respectively used for a write operation and a read operation.

15. The method of claim 10, wherein the simultaneously verifying step comprises using a sense amplifier to compare the voltage drop to a reference voltage.

16. A memory, comprising:
    an array of memory cells each comprising a resistive sense element (RSE);
    a write circuit adapted to apply a write current to a selected memory cell of the array to write a logical state to the associated RSE of said cell, the write current generating a voltage drop across the cell; and
    a sense amplifier adapted to simultaneously verify the written logic state by comparing the voltage drop to a reference voltage.

17. The memory of claim 16, in which the sense amplifier outputs a data signal in response to the voltage drop and the reference voltage, the data signal having a value indicative of the written logic state of the RSE.

18. The memory of claim 17, in which the reference voltage has a magnitude selected in relation to the written logic state so that a first reference voltage is used for a first written logic state and a different, second reference voltage is used for a different, second written logic state.

19. The memory of claim 18, further comprising a multiplexor circuit which respectively presents the first and second reference voltages to the sense amplifier responsive to an input signal indicative of said logic state.

20. The memory of claim 16, in which the sense amplifier is characterized as a first sense amplifier, the storage device further comprising a second sense amplifier coupled to the RSE which is used to subsequently verify the written logic state of the RSE responsive to an application of a read current through the selected memory cell during a subsequent read operation.

* * * * *